(12) United States Patent
Park et al.

(10) Patent No.: US 10,122,383 B2
(45) Date of Patent: Nov. 6, 2018

(54) CHANNEL DECODING METHOD AND APPARATUS USING STRUCTURED PRIORI INFORMATION OF PREAMBLE

(71) Applicant: SAMSUNG ELECTRONICS CO., LTD., Suwon-si, Gyeonggi-do (KR)

(72) Inventors: Jung-hyun Park, Hwaseong-si (KR); Sung-kyu Jung, Seongnam-si (KR); Chang-hoon Choi, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 25 days.

(21) Appl. No.: 15/617,242

(22) Filed: Jun. 8, 2017

(65) Prior Publication Data

US 2017/0359147 A1   Dec. 14, 2017

Related U.S. Application Data

(60) Provisional application No. 62/347,205, filed on Jun. 8, 2016.

(30) Foreign Application Priority Data

May 25, 2017   (KR) .................. 10-2017-0064891

(51) Int. Cl.
    *H03M 13/11*     (2006.01)
    *H04L 1/00*      (2006.01)
(52) U.S. Cl.
    CPC ....... *H03M 13/1125* (2013.01); *H04L 1/0045* (2013.01); *H04L 1/0057* (2013.01); *H04L 2001/0093* (2013.01)

(58) Field of Classification Search
    USPC ................. 455/450, 422.1; 370/236
    See application file for complete search history.

(56) References Cited

U.S. PATENT DOCUMENTS

| | | |
|---|---|---|
| 2007/0157069 A1 | 7/2007 | Lyakh et al. |
| 2008/0279312 A1 | 11/2008 | Stewart et al. |
| 2009/0181663 A1* | 7/2009 | Hu .................. H04L 49/90 455/422.1 |
| 2010/0234035 A1* | 9/2010 | Fujishima ........... H04L 5/001 455/450 |
| 2012/0117439 A1 | 5/2012 | Lee |

(Continued)

OTHER PUBLICATIONS

Search Report and Written Opinion dated Aug. 30, 2017 in counterpart International Patent Application No. PCT/KR2017/005897.

*Primary Examiner* — Eva Puente
(74) *Attorney, Agent, or Firm* — Nixon & Vanderhye, P.C.

(57) ABSTRACT

A channel decoding method is provided. The method includes storing, in a memory, a set of first log likelihood ratio (LLR) values corresponding to bits of a codeword generated by modulation of a channel-encoded signal; changing, into a preset value, at least one LLR value corresponding to previously defined bits of the codeword from among the set of the first LLR values, to generate a set of second LLR values; and performing forward error correction (FEC) based on the set of the second LLR values and an FEC code, to estimate the bits of the codeword, in which the FEC code comprises a constraint code for constricting a previously defined structural correlation between the bits of the codeword.

15 Claims, 8 Drawing Sheets

(56) References Cited

U.S. PATENT DOCUMENTS

2013/0235727 A1\* 9/2013 Campbell ............... H04L 43/10
  370/236
2014/0337682 A1 11/2014 Prodan
2015/0181281 A1 6/2015 Ko et al.
2016/0149739 A1 5/2016 Mun et al.

\* cited by examiner $$410 \quad H = \begin{bmatrix} 1 & 0 & 1 & 1 & 1 & 0 \\ 1 & 1 & 1 & 0 & 0 & 1 \\ 0 & 1 & 0 & 1 & 1 & 1 \end{bmatrix} \qquad 420 \quad X = \begin{bmatrix} X_1 \\ X_2 \\ X_3 \\ X_4 \\ X_5 \\ X_6 \end{bmatrix}$$

FIG. 5

| SYNTAX | NUMBER OF BITS | FORMAT |
|---|---|---|
| L1_Basic_signaling() { | | |
|     L1B_version | 3 | uimsbf |
|     L1B_mimo_scattered_pilot_encoding | 1 | uimsbf |
|     L1B_lls_flag | 1 | uimsbf |
|     L1B_time_info_flag | 2 | uimsbf |
|     L1B_return_channel_flag | 1 | uimsbf |
|     L1B_papr_reduction | 2 | uimsbf |
|     L1B_frame_length_mode | 1 | uimsbf |
|     if ( L1B_frame_length_mode=0 ) { | | |
|         L1B_frame_length | 10 | uimsbf |
|         L1B_excess_samples_per_symbol | 13 | uimsbf |
|     } else { | | |
|         L1B_time_offset | 16 | uimsbf |
|         L1B_additional_samples | 7 | uimsbf |
|     } | | |
|     L1B_num_subframes | 8 | uimsbf |
|     L1B_preamble_num_symbols | 3 | uimsbf |
|     L1B_preamble_reduced_carriers | 3 | uimsbf |
|     L1B_L1_Detail_content_tag | 2 | uimsbf |
|     L1B_L1_Detail_size_bytes | 13 | uimsbf |
|     L1B_L1_Detail_fec_type | 3 | uimsbf |
|     L1B_L1_Detail_additional_parity_mode | 2 | uimsbf |
|     L1B_L1_Detail_total_cells | 19 | uimsbf |
|     L1B_first_sub_mimo | 1 | uimsbf |
|     L1B_first_sub_miso | 2 | uimsbf |
|     L1B_first_sub_fft_size | 2 | uimsbf |
|     L1B_first_sub_reduced_carriers | 3 | uimsbf |
|     L1B_first_sub_guard_interval | 4 | uimsbf |
|     L1B_first_sub_num_ofdm_symbols | 11 | uimsbf |
|     L1B_first_sub_scattered_pilot_pattern | 5 | uimsbf |
|     L1B_first_sub_scattered_pilot_boost | 3 | uimsbf |
|     L1B_first_sub_sbs_first | 1 | uimsbf |
|     L1B_first_sub_sbs_last | 1 | uimsbf |
|     L1B_reserved | 48 | uimsbf |
|     L1B_crc | 32 | uimsbf |
| } | | |

CHANNEL DECODING METHOD AND APPARATUS USING STRUCTURED PRIORI INFORMATION OF PREAMBLE

CROSS-REFERENCE TO RELATED APPLICATIONS

This application is based on and claims priority under 35 U.S.C. § 119 to US Provisional Application No. 62/347,205, filed on Jun. 8, 2016, in the U.S. Patent and Trademark Office, and Korean Patent Application No. 10-2017-0064891, filed on May 25, 2017, in the Korean Intellectual Property Office, the disclosures of which are incorporated by reference herein in their entireties.

BACKGROUND

1. Field

The present disclosure relates generally to a method and an apparatus for channel decoding. For example, the present disclosure discloses a method and an apparatus for channel decoding using structured priori information of a preamble.

2. Description of Related Art

Almost all types of electronic devices and communication devices use error correction codes. The error correction codes introduce redundancy in a data stream to compensate for unique information transmission reliability in those devices.

Meanwhile, the basis for mathematical error correction was set by Shannon. Shannon developed the mathematical concept of a channel where signal distortion of communication systems is modeled as random processing. The most basic result produced by Shannon was a noisy channel principle which defines a capacity for a channel, e.g., an amount that specifies a maximum speed at which information is reliably delivered through the channel.

Reliable transmission at a near-capacity speed requires the use of error correction codes. Thus, the error correction codes are designed to be close to a possible capacity while achieving satisfactory reliability. Complexity in error correction code implementation is an additional factor that has an influence upon practical application of the error correction codes.

Although a low-density parity-check (LDPC) code, which is a type of error correction code, may not guarantee perfect transmission, an LDPC code may reduce a probability of information loss as much as desired. Such LDPC codes are error correction codes which are closest to the 'Shannon limit', and have been revaluated as excellent error correction codes applicable to communication systems.

SUMMARY

A method and an apparatus for channel decoding using structured priori information of a preamble, according to various example embodiments are provided.

Additional aspects will be set forth in part in the description which follows and, in part, will be apparent from the description.

According to an aspect of an example embodiment, a channel decoding method includes storing, in a memory, a set of first log likelihood ratio (LLR) values corresponding to bits of a codeword generated by modulation of a channel-encoded signal; changing, into a preset value, at least one LLR value corresponding to previously defined bits of the codeword among the set of the first LLR values, to generate a set of second LLR values; and performing forward error correction (FEC) based on the set of the second LLR values and an FEC code, to estimate the bits of the codeword, wherein the FEC code includes a constraint code for constricting a previously defined structural correlation between the bits of the codeword.

In the channel decoding method according to an example embodiment, the FEC code may include a low-density parity-check (LDPC) code.

In the channel decoding method according to an example embodiment, the estimating of the bits of the codeword may include determining, based on the set of the second LLR values, an update value for check nodes connected with variable nodes of the LDPC code through edges, determining an update value for the variable nodes based on the update value for the check nodes, and determining whether a decoding stop condition is satisfied through a parity check, based on the update value for the check nodes and the update value for the variable nodes.

In the channel decoding method according to an example embodiment, the constraint code may include a code in which at least one check node is incremented for the check nodes, and the at least one incremented check node may constrict a relationship between two or more variable nodes among the variable nodes.

In the channel decoding method according to an example embodiment, previously defined bits of the codeword may correspond to at least one of a reserved bit and a fixed bit of a channel-encoded preamble.

In the channel decoding method according to an example embodiment, the structural correlation may include a constraint relationship in which a specific value is not allowed for two or more bits among bits of the channel-encoded preamble.

The channel decoding method according to an example embodiment may further include determining whether the channel-encoded signal is an Advanced Television Systems Committee (ATSC) 3.0 frame or an ATSC 3.X frame.

In the channel decoding method according to an example embodiment, a position of the previously defined bits of the codeword and the changed at least one LLR value may be based on whether an encoded current frame is a time-aligned frame or a symbol-aligned frame.

According to an aspect of another example embodiment, a channel decoding apparatus includes a memory configured to store a set of first log likelihood ratio (LLR) values corresponding to bits of a codeword generated by modulation of a channel-encoded signal; a controller configured to change, into a preset value, at least one LLR value corresponding to previously defined bits of the codeword among the set of the first LLR values, to generate a set of second LLR values; and a decoder configured to perform forward error correction (FEC) based on the set of the second LLR values and an FEC code, to estimate the bits of the codeword, wherein the FEC code includes a constraint code for constricting a previously defined structural correlation between the bits of the codeword.

In the channel decoding apparatus according to an example embodiment, the FEC code may include a low-density parity-check (LDPC) code.

In the channel decoding apparatus according to an example embodiment, the decoder may be further configured to determine an update value for check nodes connected with variable nodes of the LDPC code through edges, based on the set of the second LLR values; to determine an update value for the variable nodes based on the update value for the check nodes; and to determine whether a decoding stop condition is satisfied through a parity check based on the update value for the check nodes and the update value for the variable nodes.

In the channel decoding apparatus according to an example embodiment, the constraint code may include a code in which at least one check node is incremented for the check nodes, and the at least one incremented check node may constrict a relationship between two or more variable nodes among the variable nodes.

In the channel decoding apparatus according to an example embodiment, previously defined bits of the codeword may correspond to at least one of a reserved bit and a fixed bit of a channel-encoded preamble.

In the channel decoding apparatus according to an example embodiment, the structural correlation may include a constraint relationship in which a specific value is not allowed for two or more bits among bits of the channel-encoded preamble.

BRIEF DESCRIPTION OF THE DRAWINGS

These and/or other aspects, features and attendant advantages of the present disclosure will become apparent and more readily appreciated from the following detailed description, taken in conjunction with the accompanying drawings, in which like reference numerals refer to like elements, and wherein:

FIG. 5 is a diagram illustrating an example preamble signaling data in a broadcasting signal frame, according to an example embodiment;

DETAILED DESCRIPTION

Figure 1:
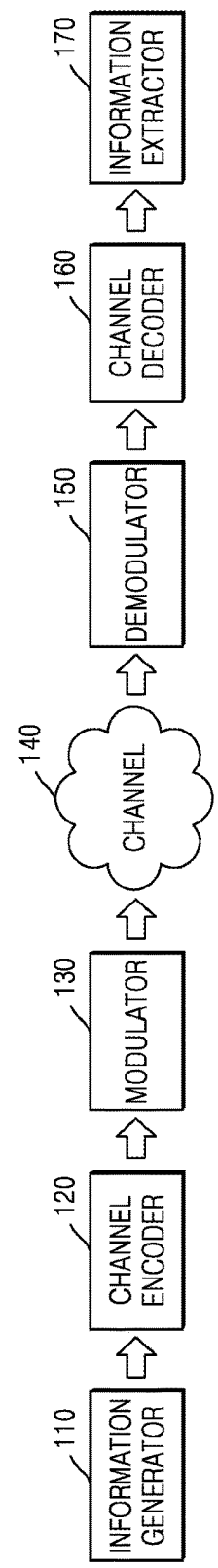
FIG. 1 is a block diagram illustrating an example system for transmitting and receiving a broadcasting signal according to an example embodiment.

Reference will now be made in greater detail to various example embodiments, examples of which are illustrated in the accompanying drawings, wherein like reference numerals refer to like elements throughout. In this regard, the present example embodiments may have different forms and should not be understood as being limited to the descriptions set forth herein. Accordingly, the example embodiments are merely described below, by referring to the figures, to explain various example aspects. Expressions such as "at least one of," when preceding a list of elements, modify the entire list of elements and do not modify the individual elements of the list.

The term "unit", as used herein, denotes a software and/or hardware component including any combinations thereof, such as, for example, and without limitation, a dedicated processor, a CPU, a Field Programmable Gate Array (FPGA) or an Application Specific Integrated Circuit (ASIC), which performs certain tasks. However, the meaning of '~unit' is not limited to software or hardware. "Unit" may advantageously be configured to reside on an addressable storage medium and configured to reproduce one or more processors. Thus, a unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and "units" may be combined into fewer components and "units" or further separated into additional components and "units".

Hereinafter, an example embodiment will be described in detail with reference to the attached drawings to allow those of ordinary skill in the art to easily carry out the embodiment. However, an example embodiment may be implemented in various forms, and are not limited to the embodiments described herein. To clearly describe an embodiment, portions that are not related to the description thereof may be omitted in the drawings.

Although terms used in an example embodiment are selected with general terms popularly used at present under the consideration of functions in the embodiment, the terms may vary according to the intention of those of ordinary skill in the art, judicial precedents, or introduction of new technology. In addition, in a specific case, terms may be arbitrarily selected, and in this case, the meanings of the terms are disclosed in a corresponding description of the disclosure. Thus, the terms used in an example embodiment should be defined not by the simple names of the terms but by the meaning of the terms and the contents throughout the embodiment.

A method and an apparatus for channel decoding, according to an example embodiment disclosed herein, relates to estimation of a bit value of an LDPC code using a log likelihood ratio (LLR) value input for the LDPC code.

Meanwhile, according to an Advanced Television Systems Committee (ATSC) 3.0 or ATSC 3.X frame, structured information of a preamble may be defined in advance. For example, a bit of a codeword may be defined in advance in a reserved or fixed manner, or a specific constraint may be added to the bit of the codeword.

A method and an apparatus for channel decoding, according to various example embodiments disclosed herein, omit an operation for estimating a previously defined bit by performing channel decoding using structured priori information of a preamble, thus improving decoding efficiency, and reduce an error flow by increasing "certainty" of a bit value.

Hereinafter, various example embodiments of the present disclosure will be disclosed with reference to the accompanying drawings.

FIG. 1 is a block diagram illustrating an example system for transmitting and receiving a broadcasting signal according to an example embodiment.

Referring to FIG. 1, a system for transmitting and receiving a broadcasting signal, according to an example embodiment, may include an information generator (e.g., including information generating circuitry and/or program elements) 110, a channel encoder (e.g., including channel encoding circuitry and/or program elements) 120, a modulator 130, a channel 140, a demodulator 150, a channel decoder (e.g., including channel decoding circuitry and/or program elements) 160, and an information extractor (e.g., including information extracting circuitry and/or program elements) 170. The information generator 110, the channel encoder 120, and the modulator 130 may be included in a broadcasting signal transmission apparatus (not shown), and the demodulator 150, the channel decoder 160, and the information extractor 170 may be included in a broadcasting signal reception apparatus (not shown). Hereinbelow, functions of respective elements will be described.

The information generator 110 generates a broadcasting signal frame by multiplexing core layer data and enhanced layer data. For example, the information generator 110 combines a core layer signal corresponding to core layer data and an enhanced layer signal corresponding to enhanced layer data at different power levels, and performs interleaving applied to both the core layer signal and the enhanced layer signal, thereby generating a multiplexed signal. The information generator 110 generates a broadcasting signal frame including a bootstrap and a preamble by using a time-interleaved signal. The broadcasting signal frame may be an ATSC 3.0 frame or an ATSC 3.X frame.

According to an example embodiment, the information generator 110 may interleave one layer signal without combining two layer signals, to generate a broadcasting signal frame.

The channel encoder 120 performs encoding for error correction with respect to the broadcasting signal frame generated by the information generator 110. According to an example embodiment, the channel encoder 120 may divide the broadcasting signal frame according to an encoding block length, in order to to generate each parity using respective divided data, generate a plurality of encoding blocks, each including a pair of divided data and a parity for the divided data, and output a code block including the generated plurality of encoding blocks.

Thus, the channel encoder 120 separately outputs a plurality of encoded packets on a code block basis, according to an error correction code scheme. An output code block is input to the modulator 130. An error correction code scheme according to an example embodiment may be based on forward error correction (FEC).

The modulator 130 modulates a code output from the channel encoder 120 into a signal that may pass through the channel 140.

Through a series of operations of the above-described elements, the broadcasting signal transmission apparatus according to an embodiment transmits a channel-encoded broadcasting signal frame through the channel 140 using an orthogonal frequency division multiplex (OFDM) communication scheme. The channel-encoded broadcasting signal frame is received via an antenna of the broadcasting signal reception apparatus. The broadcasting signal reception apparatus may receive the channel-encoded broadcasting signal frame through synchronization, channel estimation, equalization, and so forth.

The demodulator 150 detects and demodulates a bootstrap from the channel-encoded broadcasting signal frame, demodulates a preamble using information included in the bootstrap, and demodulates a data payload using information included in the preamble. In this case, the data payload may be a payload in which two or more pieces of layer data are combined.

The channel decoder 160 performs decoding with respect to the bootstrap, the preamble, and the data payload of the frame. A detailed decoding process will be described later in detail with reference to FIGS. 3 and 4.

The information extractor 170 recovers core layer data from the signal decoded by the channel decoder 160 and recovers enhanced layer data through cancellation corresponding to the recovered core layer data. In this case, the information extractor 170 generates the broadcasting signal frame first, recovers the bootstrap from the broadcasting signal frame, recovers the preamble using information included in the bootstrap, and then uses signaling information included in the preamble. The signaling information may be L1 signaling information and may include injection level information, normalizing factor information, and so forth. A more detailed structure of the broadcasting signal frame will be described below with reference to FIG. 2.

Figure 2:
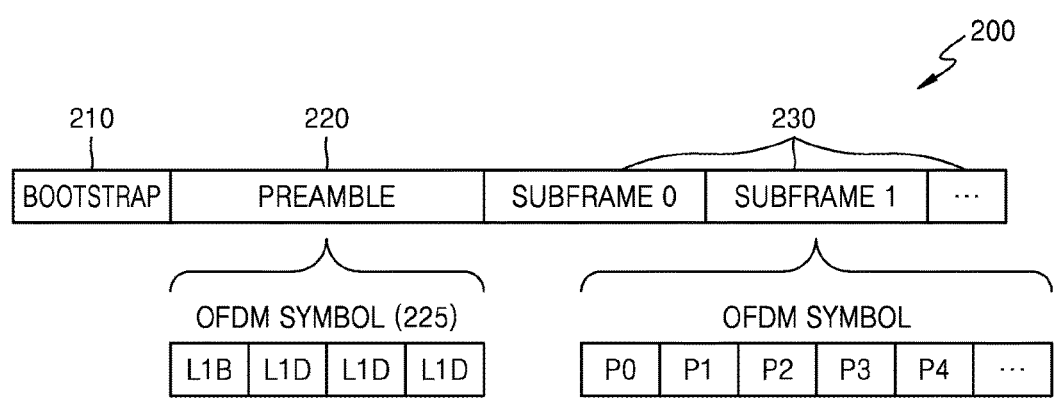
FIG. 2 is a diagram illustrating an example structure of a broadcasting signal frame according to an example embodiment.

FIG. 2 is a diagram illustrating an example structure of a broadcasting signal frame according to an example embodiment.

The broadcasting signal frame illustrated in FIG. 2 may be a broadcasting signal frame according to, for example, the ATSC 3.0 standards or the ATSC 3.X standards.

Referring to FIG. 2, a broadcasting signal frame 200 according to an example embodiment may include a bootstrap 210, a preamble 220, and subframes 230 corresponding to data symbols.

The preamble 220 according to an embodiment may include signaling information. In an example illustrated in FIG. 2, the preamble 220 may include OFDM symbols 225 such as L1-Basic (L1B) and L1-Detail (L1D).

L1B may be fixed-length signaling information. For example, L1B may correspond to 200 bits. L1D may be variable-length signaling information. For example, L1D may correspond to 200-2352 bits.

The broadcasting signal frame 200 begins with the bootstrap 210 including system version information and the most basic signaling information, and is followed by L1B and L1D. L1B may deliver general signaling information such as the number of physical layer pipes (PLPs), a fast Fourier transform (FFT) size, a guard interval, modulation/code rate information for L1D, etc., through a specific number of bits, and L1D may deliver other detailed signaling information. The number of bits of L1D may vary with the number of PLPs.

The bootstrap 210 may signal a bit-interleaved coded modulation (BICM) mode and an OFDM parameter of L1B, and L1B may signal a BICM mode and an OFDM parameter of L1D. In this case, the BICM mode may include a constellation and a code rate, and the OFDM parameter may include an FFT size, a guard interval length, and a pilot pattern.

The present disclosure includes the disclosure of a method and an apparatus for channel decoding for the broadcasting signal frame 200. In particular, the method and the apparatus for channel decoding disclosed may be based on structural characteristics of the preamble 220 included in the broadcasting signal frame 200. For channel decoding, low-density parity-check (LDPC) using an LDPC matrix may be performed.

Among FEC techniques, along with turbo encoding, an LDPC code has an error correction capability that is closest to a channel capacity limit presented by Shannon. LDPC decoding is performed using a parity check matrix H and a Tanner graph, and the parity check matrix H may be expressed with the Tanner graph. As many check nodes as rows in the parity check matrix H are generated and as many variable nodes as columns in the parity check matrix H are generated, thus forming a Tanner graph. If an (i, j) element of the matrix is 1, an $i^{th}$ check node is edge-connected with a $j^{th}$ variable node, such that the $i^{th}$ check node and the $j^{th}$ variable node are neighboring nodes.

More specifically, a channel decoding process using an LDPC code will be described in greater detail with reference to FIGS. 3 and 4 below.

Figures 3, 4:
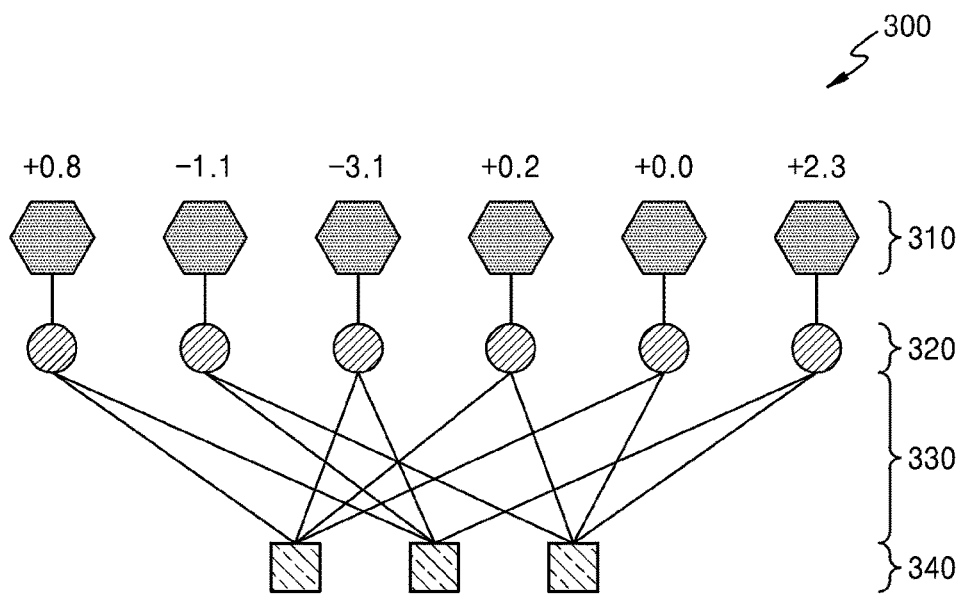
FIG. 3 is a diagram illustrating a Tanner graph of channel decoding according to an example embodiment.
FIG. 4 is a diagram illustrating an example low-density parity-check (LDPC) code corresponding to the Tanner graph of FIG. 3.

FIG. 3 illustrates a Tanner graph of channel decoding according to an example embodiment.

Values of LDPC codes may satisfy LDPC constraints. Typically, parity check constraints may be defined by a graph including multiple variable nodes and multiple check nodes capable of taking code values.

Referring to FIG. 3, LDPC codes may be expressed by bipartite graphs such as a Tanner graph 300.

In the Tanner graph 300, log likelihood ratio (LLR) values 310 corresponding to bits of a codeword are input to variable nodes 320, and check nodes 340 in another set of nodes correspond to a parity-check constraint set that defines a code.

In the graph 300, edges 330 connect the variable nodes 320 to the check nodes 340. The variable nodes 320 and the check nodes 340 are referred to as neighbors if they are connected by the edges 330 in the graph 300. A parity check may be expressed by a corresponding matrix including columns indicating check nodes and rows indicating variable nodes, and a value of 1 may indicate a link between nodes and a value of 0 may indicate absence of a link. LDPC codes may be equivalently expressed using an LDPC matrix.

FIG. 4 is a diagram illustrating an example LDPC code corresponding to the Tanner graph of FIG. 3 according to an example embodiment.

Referring to FIG. 4, the LDPC code may be expressed as an LDPC matrix H 410. If a relationship Hx=0 is established between the LDPC matrix H 410 and an indicated vector X 420, the vector X 420 corresponds to an errorless case.

For example, if a channel encoding apparatus transmits a codeword c in which a source message and a parity check bit are combined, then the relationship between the LDPC matrix H and the codeword c may be as follows:

$$Hc=0 \quad (1),$$

where H refers to an LDPC matrix and c refers to a codeword in which a source message and a parity check bit are combined.

Meanwhile, if the channel encoding apparatus transmits the codeword c, a noise component n may be added through a channel, and a channel decoding apparatus may receive a noise-added signal r.

$$r=c+n \quad (2)$$

The channel decoding apparatus performs an operation using an LDPC matrix to obtain the codeword c, and further, the source message s, from the received signal r. That is, because Hc=0, an operation like Equation 3 may be established.

$$Hr=Hc+Hn=Hn \quad (3)$$

The received signal r may be a digital signal 0 or 1, or may be a fractional number between 0 and 1.

If the fractional number between 0 and 1 is received using the LDPC matrix, the channel decoding apparatus may select a proper value using a probability of the received signal r being 0 or 1.

The received signal r may be used to indicate an input probability at a variable node of a bipartite graph. A bit probability message is delivered to a check node from a variable node, and is summed at a variable node according to parity check constraints. This data may be generally expressed as an LLR defined as in:

$$L(r) = \log\left(\frac{P(r=0)}{P(r=1)}\right) \quad (4)$$

An LDPC code used in channel decoding may be a macro matrix indicating a block row and a block column of an LDPC matrix. That is, a 0 entry of the macro matrix may correspond to a partial matrix of Z×Z.

Meanwhile, as an iterative decoding method for updating a probability with respect to an input node, Equations 5 through 9 provided below may be used.

The method may be expressed as a defined LLR.

$$L(q_{mj})=L(q_j)-R_{mj} \quad (5)$$

Equation 5 may refer to a row-specific LLR value for each column j of each row m of a checksum partial set. That is, in Equation 5, $L(q_{mj})$ may refer to an LLR value for a$L(q_{mj})$ variable node. Herein, $R_{mj}$ denotes a check node value, and L(qj) denotes a variable node value.

$$A_{mj} = \sum_{\substack{n \in N(m) \\ n \neq j}} \Psi(L(q_{mn})) \quad (6)$$

Equation 6 may refer to a size value $A_{mj}$ of an operated check node based on an LLR value $L(q_{mn})$.

$$s_{mj} = \prod_{\substack{n \in N(m) \\ n \neq j}} \text{Sign}(L(q_{mn})) \quad (7)$$

Equation 7 may refer to a code $s_{mj}$ of an operated check node based on an LLR value $L(q_{mn})$.

$$R_{mj}=-s_{mj}\Psi(A_{mj}) \quad (8)$$

Equation 8 may refer to an operated check node update value $R_{mj}$ based on the size value $A_{mj}$ and the code $s_{mj}$ of the check node.

$$L(q_j)=L(q_{mj})+R_{mj} \quad (9)$$

Equation 9 may refer to an operated variable node update value L(qj) based on the check node update value $R_{mj}$ and the LLR value $L(q_{mj})$. For a column j, a variable node value may be updated.

If decoding is performed by operations based on Equations 5 through 9, existence or absence of an error may be determined by:

$$Hr=0 \quad (10)$$

where if Hr=0, it is determined that proper decoding has been performed, and thus a decoding stop condition is satisfied. If it is determined that a decoding stop condition is not satisfied, a check node update and a variable node update are performed again.

Meanwhile, if the decoding stop condition is not satisfied, a check node update and a variable node update are continuously performed until the decoding stop condition is satisfied, and in this case, the amount of computation highly increases.

A method and an apparatus for channel decoding, according to an embodiment, minimizes the amount of computation required for estimation of bits of a channel-encoded codeword, by using structured priori information of a preamble of a broadcasting signal frame.

The structured priori information of the preamble, according to an embodiment, may mean that a bit of the codeword is previously defined in a reserved or fixed manner, or a constraint is added to a bit of the codeword.

Before channel decoding according to an example embodiment is described, structural characteristics of a preamble of a broadcasting signal frame will be described with reference to FIG. 5.

FIG. 5 is a chart illustrating example preamble signaling data in a broadcasting signal frame according to an example embodiment.

Preamble signaling data 500 illustrated in FIG. 5 corresponds to L1B that is fixed-length (200-bit) signaling information in a signaling layer structure of the broadcasting signal frame 200 illustrated in FIG. 2.

Referring to FIG. 5, a specific number of bits are assigned to indicate each piece of preamble signaling data 500. As will be described later, in the ATSC 3.0 standards, a bit assigned for each piece of preamble signaling data 500 may be previously defined as a specific value. Depending on circumstances, in the ATSC 3.0 standards, there may be a constraint condition where a specific value is not allowed for a bit assigned for each piece of preamble signaling data 500. That is, some of the preamble signaling data 500 according to the ATSC 3.0 standards may have priori information properties. Thus, by using such structural characteristics of a preamble for decoding of the preamble, decoding performance may be enhanced. A channel decoding process using structural characteristics of a preamble, according to an embodiment, will be later described in detail with reference to FIGS. 6 and 7.

Details of the preamble signaling data 500 are as described below.

"L1B_version" indicates a version of an L1B signaling structure used for a current frame. A total of three bits are assigned for signaling of "L1B_version". In the ATSC 3.0 standards, the three bits for "L1B_version" are previously defined as '000'.

"L1B_mimo_scattered_pilot_encoding" indicates a multiple-input and multiple-output (MIMO) pilot encoding scheme used for a MIMO subframe in the current frame.

"L1B_lls_flag" indicates whether low-level signaling (LLS) exists in one or more PLPs of the current frame.

"L1B_time_info_flag" indicates whether timing information of the current frame exists.

"L1B_return_channel_flag" indicates whether a dedicated return channel (DRC) exists.

"L1B_papr_reduction" indicates a form of reduction of a peak-to-average power ratio in the current frame.

If "L1B_frame_length_mode" is '0', it indicates that the current frame has excessive sample distribution and is time-aligned with a guard interval of a payload OFDM symbol. If "L1B_frame_length_mode" is '1', it indicates that the current frame is symbol-aligned without excessive sample distribution.

"L1B_frame_length" is information signaled when "L1B_frame_length_mode" is '0', and indicates a time interval from the first sample of a bootstrap of the current frame to the last sample of the current frame. The time interval is expressed on a 5 ms basis. A minimum length of a frame is 50 ms and a maximum length thereof is 5 s, such that "L1B_frame_length" has a value that is greater than or equal to 10 and less than 1000. Thus, in a bit assigned for "L1B_frame_length", as much information as the power of 2 may not be entirely used.

"L1B_excess_samples_per_symbol" is information signaled when "L1_frame_length_mode" is '0', and indicates the number of excessive samples.

"L1B_time_offset" is information signaled when "L1B_frame_length_mode" is '1', and indicates the number of sample intervals existing between the two closest boundaries.

"L1B_additional_samples" is information signaled when "L1B_frame_length_mode" is '1', and indicates the number of samples added to an end of the frame. A total of seven bits are assigned for signaling of "L1B_additional_samples". In the ATSC 3.0 standards, the seven bits for "L1B_additional_samples" are previously defined as '0000000'.

"L1B_num_subframes" indicates the number of subframes in the current frame.

"L1B_preamble_num_symbols" indicates a value obtained by subtracting 1 from the total number of preamble OFDM symbols.

"L1B_preamble_reduced_carriers" indicates the number of control units of a carrier of the preamble.

"L1B_L1_Detail_content_tag" indicates whether L1D of the current frame has a modification when compared to L1D of a previous frame.

"L1B_U_Detail_size_bytes" indicates the size of L 1D information.

"L1B_L1_Detail_fec_type" indicates an FEC type of L1 D. A total of three bits are assigned for signaling of "L1B_L1_Detail_fec_type". In the ATSC 3.0 standards, '111' out of the three bits for "L1B_L1_Detail_fec_type" is not used.

"L1B _L1_Detail _additional_parity_mode" indicates an additional parity mode. A total of two bits are assigned for signaling of "L1B_U_Detail_additional_parity_mode". In the ATSC 3.0 standards, '11' out of the two bits for "L1B_U_Detail_additional_parity_mode" is not used.

"L 1B_U_Detail_total_cells" indicates a total size of additional parity bits for an L1D signaling bit of the current frame and an L1D signaling bit of a next frame.

"L1B_first_sub_mimo" indicates whether MIMO is used for the first subframe of the current frame.

"L1 B_first_sub_m iso" indicates whether multiple-input single-output (MISO) is used for the first subframe of the current frame. A total of two bits are assigned for signaling of "L1 B_first_sub_m iso". In the ATSC 3.0 standards, '11' out of the two bits for "L1B_first_sub_miso" is not used.

"L1B_first_sub_fft_size" indicates an FFT size of the first subframe of the current frame. A total of two bits are assigned for signaling of "L1 B_first_sub_fft_size". In the ATSC 3.0 standards, the FFT size of the first subframe is equal to the FFT size of the preamble, such that the two bits for "L1B_first_sub_fft_size" may be handled as redundant information (i.e., previously defined information).

"L1 B first_ sub_ reduced carriers" indicates the number of control units of a _carrier of the first subframe of the current frame.

"L1 B_first_sub_guard_interval" indicates a length of a guard interval used for an OFDM symbol of the first subframe of the current frame. A total of four bits are assigned for signaling of "L1 B_first_sub_guard_interval". In the ATSC 3.0 standards, the length of a guard interval used for the OFDM symbol of the first subframe is equal to the length of a guard interval of a preamble of the same frame. Thus, the four bits for "L1B_first_sub_guard_interval" may be handled as redundant information (that is, previously defined information).

"L1 B_first_sub_num_ofdm_symbols" indicates a value obtained by subtracting 1 from the total number of data payload OFDM symbols in the first subframe of the current frame.

"L1 B_first_sub_scattered_pilot_pattern" indicates a scattered pilot pattern used for the first subframe of the current frame. A total of five bits are assigned for signaling of "L1 B_first_sub_scattered_pilot_pattern". In the ATSC 3.0 standards, "L1B_first_sub_scattered_pilot_pattern" are previously defined as 'Oxxxx'. Thus, in the ATSC 3.0 standards, one bit out of the five bits assigned for "L1B_first_sub_scattered_pilot_pattern" is fixed as previously defined information.

"L1 B_first_sub_scattered_pilot_boost" indicates a decibel (Db) value of the scattered pilot used for the first subframe of the current frame. A total of three bits are assigned for signaling of "L1_first_sub_scattered_pilot_boost". In the ATSC 3.0 standards, '101', '110', and '111' out of the three bits for "L1B_first_sub_scattered_pilot_boost" are not used.

"L1B_first_sub_sbs_first" indicates whether the first symbol of the first subframe of the current frame is a subframe boundary symbol.

"L1B_first_sub_sbs_last" indicates whether the last symbol of the first subframe of the current frame is a subframe boundary symbol.

"L 1B_reserved" includes a reserved bit for an updated version of L1B. In the ATSC 3.0 standards, 48 bits are previously defined as '0'.

"L1B_crc" indicates a cyclic redundancy check (CRC) value.

As described above, in the ATSC 3.0 standards, some bits of the preamble signaling data 500 may be previously defined as a particular value, and a constraint condition may be applied in which a specific value is not allowed for some other bits.

According to an example embodiment, depending on whether "L 1B_frame_length_mode" among 200 bits expressing the preamble signaling data 500 has a value of '0' or '1', the number of previously defined bits and the number of bits to which the constraint condition is applied may be determined. If "L1B_frame_length_mode"0 is '0', 58 bits are previously defined and the constraint condition is applied to 23 bits. If "L1B_frame_length_mode" is '1', 65 bits are previously defined and the constraint condition is applied to 13 bits.

Hereinbelow, a method of performing channel decoding using the above-described structural characteristics of a preamble will be described below.

Figure 6:
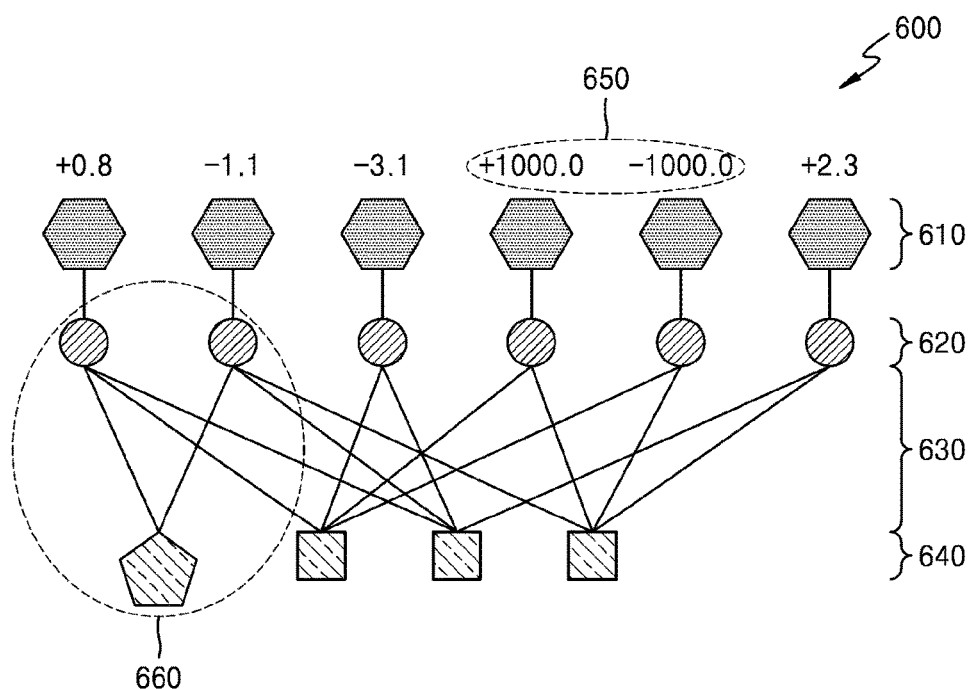
FIG. 6 is a diagram illustrating a Tanner graph of a method of performing channel decoding using structured priori information of a preamble, according to an example embodiment.

FIG. 6 is a diagram illustrating an example Tanner graph of a method of performing channel decoding using structured priori information of a preamble, according to an example embodiment.

Referring to FIG. 6, a Tanner graph 600 is illustrated which includes variable nodes 620 to which LLR values 610 corresponding to bits of a codeword are input, check nodes 640, and edges 630 connecting the variable nodes 620 with the check nodes 640.

In LDPC decoding, LLR values of respective bits to be decoded are "soft" data such as an analog probability. That is, reliability for respective bits may be determined through an LLR value. However, an LLR value may sometimes cause a decoding error due to delivery of an inaccurate value. For example, there may be errors where in some bits, one value (e.g., '0') may be dominant, but they actually have another value (e.g., '1'). Such an inaccurate LLR increases an error flow for LDPC decoding.

A method of channel decoding according to an embodiment considers that a previously defined bit value for a particular bit is known in advance. Disclosed embodiments may selectively change LLR values to increase "certainty" of the LLR values corresponding to previously defined bits.

According to an example embodiment, LLRs having values fixed by structured priori information of a preamble are input to the variable nodes 620. Referring to FIG. 6, at least one of LLR values corresponding to previously defined bits of a codeword may be changed to preset values 650. That is, according to an embodiment, LLR values changed to the preset values 650 in place of LLR values generated by demodulating a channel-encoded signal may be used as inputs to the variable nodes 620. For example, if a bit at a particular position of a codeword is previously defined as a particular value, a fixed value (e.g., an LLR value having a large magnitude) may be enforced for an LLR corresponding to the position.

According to an example embodiment, an LLR corresponding to a previously defined bit may be processed as having a fixed magnitude (e.g., a maximum LLR magnitude or an infinite LLR magnitude) and prevents the LLR value from changing during decoding. When the LLR has a maximum or infinite LLR magnitude value at a previously defined bit position, the "certainty" of the bit value is reinforced during decoding, thereby guaranteeing the accuracy of decoding.

According to an example embodiment, a parity check based on a check node 660 incremented during channel decoding may be performed.

According to an example embodiment, an error correction code for channel decoding may include a constraint code for constricting a previously defined structural correlation between bits of a codeword. A constraint code according to an example embodiment may include at least one incremented check node 660 for the check nodes 640. The incremented check node 660 may constrict a relationship between two or more variable nodes among the variable nodes 620. For example, if there is a constraint condition where a bit corresponding to the first variable node and a bit corresponding to the second variable node are the same as each other, a check node connecting the first variable node with the second variable node may be incremented. The incremented check node 660 may express distinct parity bits with the two bits corresponding to the first variable node and the second variable node, respectively. Thus, an amount of computation may be reduced by as much as the amount of information for bits having a structural correlation.

Figure 7:
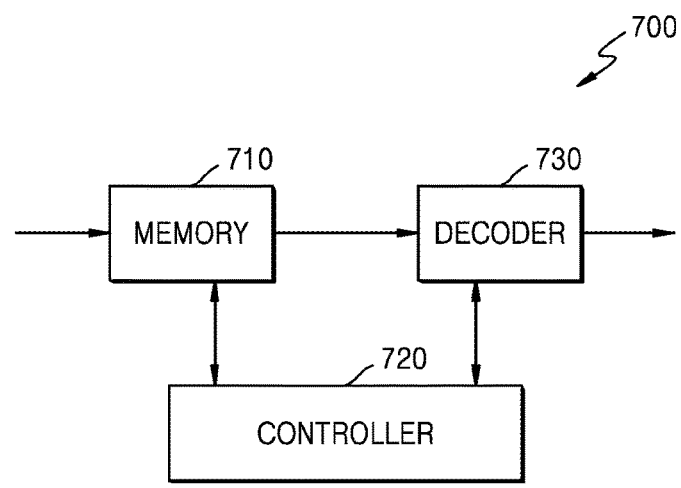
FIG. 7 is a block diagram illustrating an example channel decoding apparatus according to an example embodiment.

FIG. 7 is a block diagram illustrating an example channel decoding apparatus 700 according to an example embodiment.

Referring to FIG. 7, the channel decoding apparatus 700 may include a memory 710, a controller (e.g., including processing circuitry) 720, and a decoder 730.

The channel decoding apparatus 700 according to an example embodiment performs channel decoding using structured priori information of a preamble as described above.

The memory 710 according to an example embodiment stores a set of LLR values corresponding to bits of a codeword generated by modulation of a channel-encoded signal. The memory 710 may include a variable node memory (not shown) and a check node memory (not shown). The variable node memory (not shown) stores the variable node value $L(q_{mj})$ of Equation 5 or the variable node update value $L(q_j)$ of Equation 9. The check node memory (not shown) stores the size value $A_{mj}$ of the check node of Equation 6, the code $s_{mj}$ of the check node of Equation 7, and a size value and position information of the code.

The controller 720 according to an embodiment may include various processing circuitry and changes, into a preset value, at least one LLR value corresponding to previously defined bits of a codeword among a set of the LLR values stored in the memory 710. The previously defined bits of the codeword may correspond to at least one of a reserved bit and a fixed bit of a channel-encoded preamble.

The controller 720 according to an embodiment adds a constraint code for constricting a previously defined structural correlation between bits of a codeword to an FEC code. The constraint code may include a code in which at least one check node is incremented for check nodes. A relationship between two or more variable nodes among the variable nodes may be constricted by the incremented check node.

The decoder 730 according to an example embodiment performs FEC using the FEC code based on a set of the LLR values changed by the controller 720, thereby estimating the bits of the codeword. The decoder 730 determines, based on the set of the changed LLR values, an update value for check nodes connected with variable nodes of an LDPC code through edges. The decoder 730 according to an embodiment determines, based on the update value for the check nodes, an update value for the variable nodes. The decoder 730 determines whether a decoding stop condition is satisfied by a parity check, based on the update value for the check nodes and the update value for the variable nodes.

For example, the decoder 730 performs operations of Equations 5 through 10. That is, the decoder 730 calculates a row-specific LLR value for each column j of a row m of an LDPC matrix. The decoder 730 calculates (determines) the size value $A_{mj}$ of the check node and the code $s_{mj}$ of the check node based on the LLR. The decoder 730 calculates the check node update value $R_{mj}$ based on the size value $A_{mj}$ of the check node and the code $s_{mj}$ of the check node. The decoder 730 calculates the variable node update value $L(qi)$ based on the check node update value $R_{mj}$ and the LLR value $L(q_{mj})$.

Figure 8:
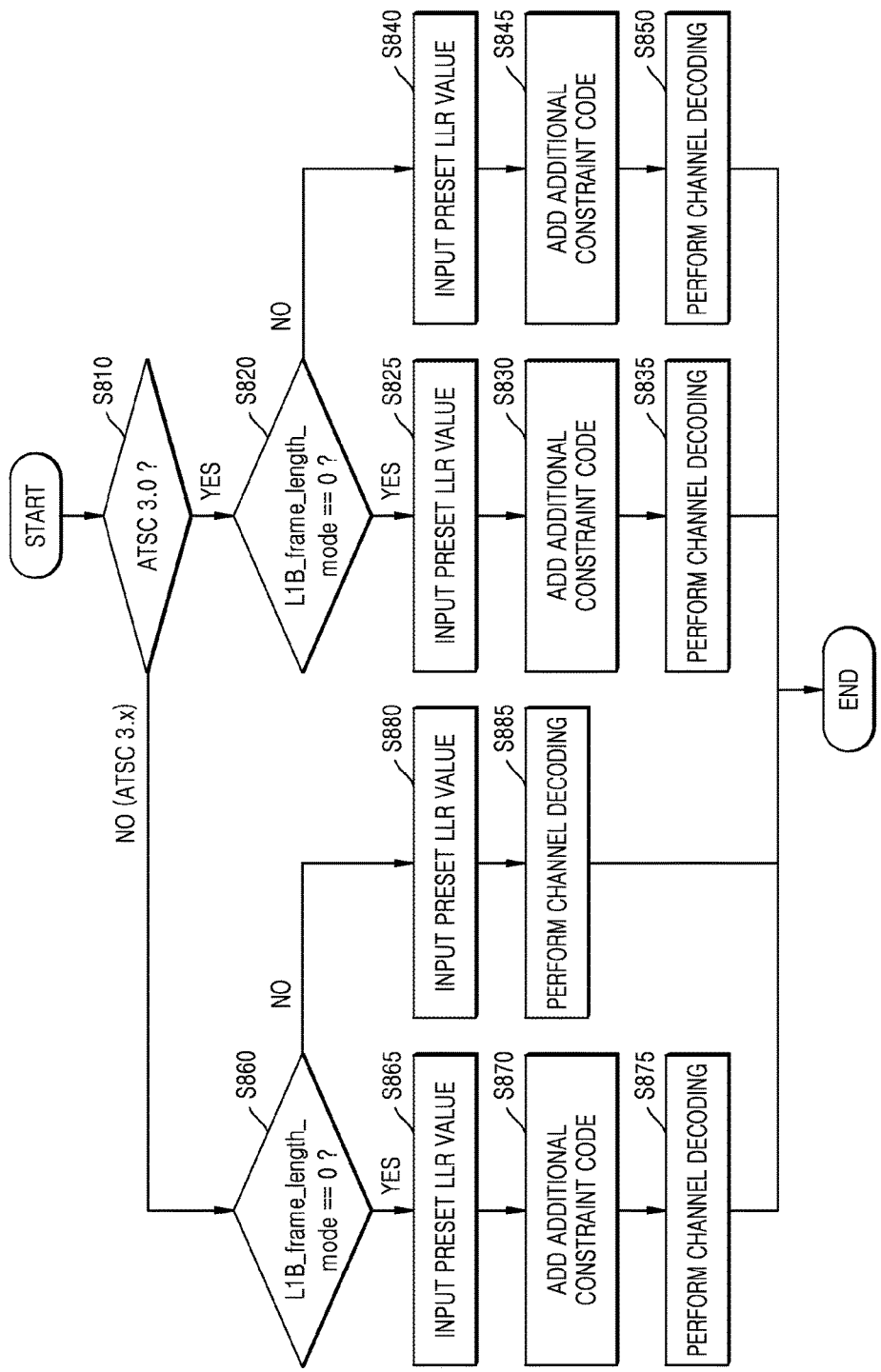
FIG. 8 is a flowchart illustrating an example channel decoding with respect to an Advanced Television Systems Committee (ATSC) 3.0 or ATSC 3.X frame, according to an example embodiment.

FIG. 8 is a flowchart illustrating example channel decoding with respect to an ATSC 3.0 or ATSC 3.X frame, according to an example embodiment.

Referring to FIG. 8, the structured priori information of the preamble may be applied differently based on whether an encoded frame is an ATSC 3.0 frame or an ATSC 3.X frame.

As described with reference to FIG. 5, some bits in the ATSC 3.0 frame are previously defined as a particular value, and there is a constraint condition in which a specific value is not allowed for some other bits. More specifically, if the encoded current frame is a time-aligned frame (that is, when "L1B_frame_length_mode" is '0'), the previously defined number of bits is 58 and the number of bits to which the constraint condition is applied is 23. If the encoded current frame is a symbol-aligned frame (that is, when "L1B_frame_length_mode" is '1'), the previously defined number of bits is 65 and the number of bits to which the constraint condition is applied is 13.

In the ATSC 3.X frame, the previously defined number of bits and the number of bits to which the constraint condition is applied may be different from those in the ATSC 3.0 frame. Thus, the channel decoding apparatus 700 according to an embodiment performs channel decoding based on whether the encoded frame is the ATSC 3.0 frame or the ATSC 3.X frame.

Referring to FIG. 8, the channel decoding apparatus 700 determines whether an encoded frame is an ATSC 3.0 frame in operation S810. According to an example embodiment, if the encoded frame is the ATSC 3.0 frame, the channel decoding apparatus 700 determines whether "L1B_frame_length_mode" is '0' in operation S820. If "L1B_frame_length_mode" is '0', the channel decoding apparatus 700 inputs a preset LLR value for 58 previously defined or known bits in operation S825, adds a code for constricting a structural correlation between 23 bits in operation S830, and performs channel decoding in operation S835. If "L1B_frame_length_mode" is '1', the channel decoding apparatus 700 inputs a preset LLR value for 65 previously defined or known bits in operation S840, adds a code for constricting a structural correlation between 13 bits in operation S845, and performs channel decoding in operation S850.

According to an example embodiment, if the encoded frame is not the ATSC 3.X frame, the channel decoding apparatus 700 determines whether "L1B_frame_length_mode" is '0' in operation S860. If "L1B_frame_length_mode" is '0', the channel decoding apparatus 700 inputs a preset LLR value for a specific number of previously defined or known bits in operation S865, adds a code for constricting a structural correlation between the specific number of bits in operation S870, and performs channel decoding in operation S875. If "L1B_frame_length_mode" is '1', the channel decoding apparatus 700 inputs a preset LLR value for a specific number of previously defined or known bits in operation S880, and performs channel decoding in operation S885.

Figure 9:
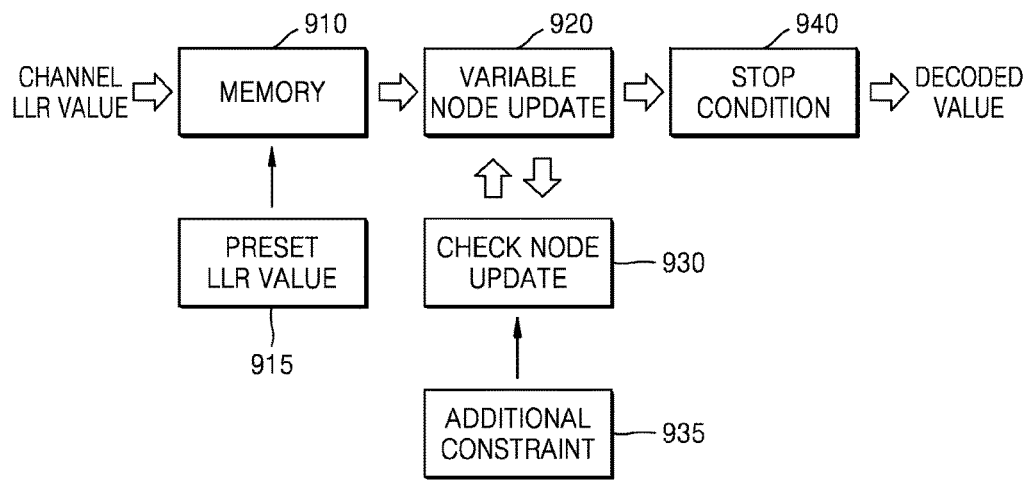
FIG. 9 is a diagram illustrating an example channel decoding process including an LDPC code, according to an example embodiment.

FIG. 9 is a diagram illustrating an example channel decoding process including an LDPC code, according to an example embodiment.

Referring to FIG. 9, the channel decoding apparatus 700 stores, in a memory 910, channel LLR values corresponding to bits of a codeword generated by demodulating a channel-encoded signal. The channel decoding apparatus 700 changes, into a preset value 915, at least one LLR value corresponding to previously defined bits of a codeword among the channel LLR values stored in the memory 910.

The channel decoding apparatus 700 according to an embodiment adds an additional constraint 935 for indicating a previously defined structural correlation between bits. The channel decoding apparatus 700 performs a check node update 930 based on the changed LLR values, and performs a variable node update 920 based on the updated check node.

The channel decoding apparatus 700 according to an embodiment determines whether a decoding stop condition 940 is satisfied by a parity check based on a value of the updated variable node. If the decoding stop condition 940 is satisfied, the channel decoding apparatus 700 outputs a decoded value. If it is determined that the decoding stop condition 940 is not satisfied, the channel decoding apparatus 700 may repeatedly perform the check node update 930 and the variable node update 920.

While a channel decoding process including an LDPC code is described with reference to FIG. 9, various example embodiments disclosed may also be applied to a channel decoding process without including an LDPC code.

Figure 10:
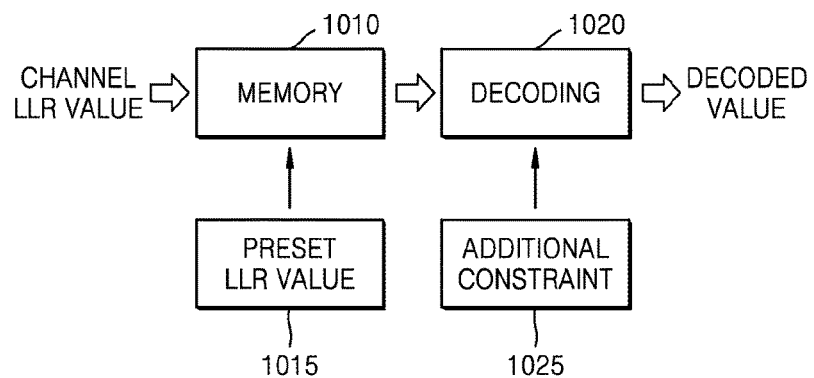
FIG. 10 is a diagram illustrating an example channel decoding process without including an LDPC code, according to an example embodiment.

FIG. 10 is a diagram illustrating an example channel decoding process not including an LDPC code, according to an example embodiment.

Referring to FIG. 10, the channel decoding apparatus 700 stores, in a memory 1010, channel LLR values corresponding to bits of a codeword generated by demodulating a channel-encoded signal. The channel decoding apparatus 700 changes, into a preset value 1015, at least one LLR value corresponding to previously defined bits of a codeword among the channel LLR values stored in the memory 1010.

The channel decoding apparatus 700 according to an embodiment adds an additional constraint 1025 for indicating a previously defined structural correlation between bits. The channel decoding apparatus 700 may perform decoding 1020 based on the changed LLR values and the added constraint code. Thereafter, the channel decoding apparatus 700 outputs a decoded value.

Figure 11:
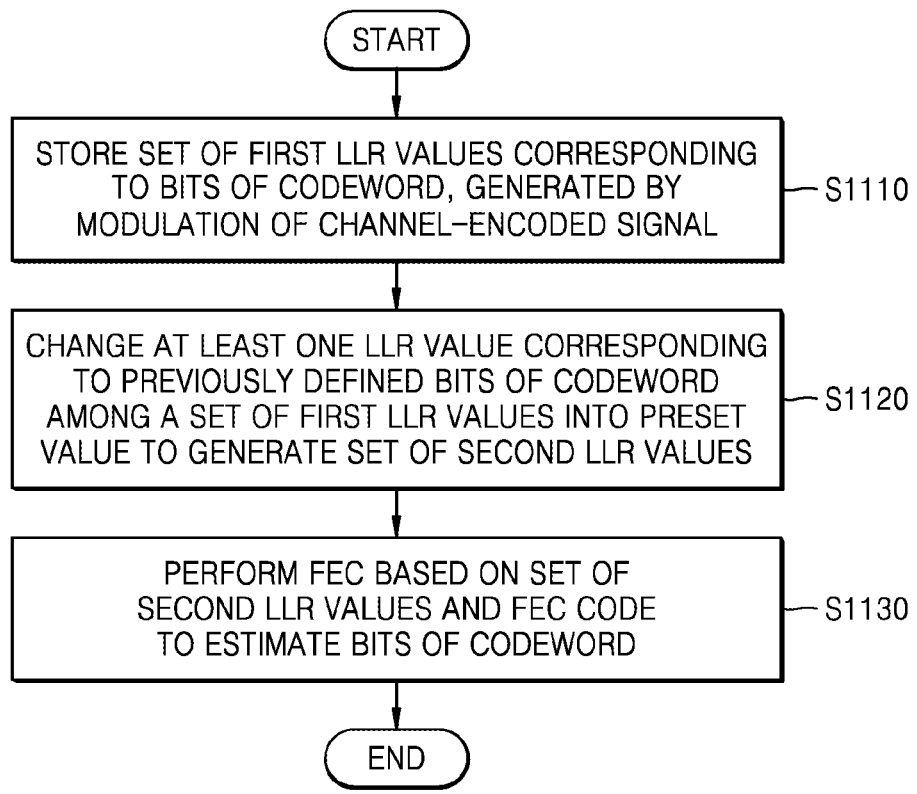
FIG. 11 is a flowchart illustrating an example channel decoding method according to an example embodiment.

FIG. 11 is a flowchart illustrating an example channel decoding method, according to an example embodiment.

In operation S1110, the channel decoding apparatus 700 stores, in a memory, a set of first LLR values corresponding to bits of a codeword generated by modulation of a channel-coded signal.

In operation S1120, to generate a set of second LLR values, the channel decoding apparatus 700 changes, into a preset value, at least one LLR value corresponding to previously defined bits of the codeword among the set of the first LLR values.

In operation S1130, the channel decoding apparatus 700 performs FEC, based on the set of the second LLR values and the FEC code, to estimate the bits of the codeword. The FEC code may include a constraint code for constricting a previously defined structural correlation between the bits of the codeword.

While the present disclosure has been described with reference to limited embodiments and drawings as described above, the present disclosure is not limited to the disclosed embodiments and it would be apparent to those of ordinary skill in the art that various modifications and changes may be possible from the disclosure. Therefore, the spirit of the present disclosure should be defined by the appended claims and any equal or equivalent modification may fall within the category of the spirit of the present disclosure. Moreover, a system according to the present disclosure may be implemented as a computer-readable code on a computer-readable recording medium.

In addition, the computer-readable recording medium may include any type of recording devices that stores data readable by a computer system. Examples of the recording medium may include a read-only memory (ROM), a compact disc read-only memory (CD-ROM), a magnetic tape, a floppy disk, an optical data storage device, and so forth. The computer-readable recording medium may be distributed over network coupled computer systems so that a computer-readable code is stored and executed in a distributed fashion.

It should be understood that the various example embodiments described herein should be considered in a descriptive sense only and not for purposes of limitation. Descriptions of features or aspects within each embodiment should typically be considered as available for other similar features or aspects in other embodiments.

While one or more example embodiments have been described with reference to the figures, it will be understood by those of ordinary skill in the art that various changes in form and details may be made therein without departing from the spirit and scope as defined by the following claims.

What is claimed is:

1. A channel decoding method comprising:
storing, in a memory, a set of first log likelihood ratio (LLR) values corresponding to bits of a codeword generated by modulation of a channel-encoded signal;
changing, into a preset value, at least one LLR value corresponding to previously defined bits of the codeword from among the set of the first LLR values, to generate a set of second LLR values; and
performing forward error correction (FEC), based on the set of the second LLR values and an FEC code, to estimate the bits of the codeword,
wherein the FEC code comprises a constraint code for constricting a previously defined structural correlation between the bits of the codeword.

2. The channel decoding method of claim 1,
wherein the FEC code comprises a low-density parity-check (LDPC) code.

3. The channel decoding method of claim 2,
wherein to estimate the bits of the codeword comprises:
determining, based on the set of the second LLR values, an update value for check nodes connected with variable nodes of the LDPC code through edges;
determining an update value for the variable nodes based on the update value for the check nodes; and
determining whether a decoding stop condition is satisfied through a parity check, based on the update value for the check nodes and the update value for the variable nodes.

4. The channel decoding method of claim 3,
wherein the constraint code comprises a code in which at least one check node is incremented for the check nodes, and
the at least one incremented check node constricts a relationship between two or more variable nodes among the variable nodes.

5. The channel decoding method of claim 1,
wherein previously defined bits of the codeword correspond to at least one of a reserved bit and a fixed bit of a channel-encoded preamble.

6. The channel decoding method of claim 1,
wherein the structural correlation comprises a constraint relationship in which a specific value is not allowed for two or more bits among bits of a channel-encoded preamble.

7. The channel decoding method of claim 1,
further comprising
determining whether the channel-encoded signal is an Advanced Television Systems Committee (ATSC) 3.0 frame or an ATSC 3.X frame.

8. The channel decoding method of claim 7,
wherein a position of the previously defined bits of the codeword and the changed at least one LLR value are based on whether an encoded current frame is a time-aligned frame or a symbol-aligned frame.

9. A channel decoding apparatus comprising:
a memory configured to store a set of first log likelihood ratio (LLR) values corresponding to bits of a codeword generated by modulation of a channel-encoded signal;
a controller configured to change, into a preset value, at least one LLR value corresponding to previously defined bits of the codeword from among the set of the first LLR values, to generate a set of second LLR values; and
a decoder configured to perform forward error correction (FEC) based on the set of the second LLR values and an FEC code, to estimate the bits of the codeword, wherein the FEC code comprises a constraint code for constricting a previously defined structural correlation between the bits of the codeword.

10. The channel decoding apparatus of claim 9, wherein the FEC code comprises a low-density parity-check (LDPC) code.

11. The channel decoding apparatus of claim 10, wherein the decoder is further configured to determine an update value for check nodes connected with variable nodes of the LDPC code through edges, based on the set of the second LLR values; to determine an update value for the variable nodes, based on the update value for the check nodes; and to determine whether a decoding stop condition is satisfied through a parity check, based on the update value for the check nodes and the update value for the variable nodes.

12. The channel decoding apparatus of claim 11, wherein the constraint code comprises a code in which at least one check node is incremented for the check nodes, and the at least one incremented check node constricts a relationship between two or more variable nodes among the variable nodes.

13. The channel decoding apparatus of claim 9, wherein previously defined bits of the codeword correspond to at least one of a reserved bit and a fixed bit of a channel-encoded preamble.

14. The channel decoding apparatus of claim 9, wherein the structural correlation comprises a constraint relationship in which a specific value is not allowed for two or more bits among bits of a channel-encoded preamble.

15. A non-transitory computer-readable recording medium having recorded thereon a program which, when executed by a computer, performs the method of claim 1.

* * * * *